United States Patent
Heightley

(10) Patent No.: US 7,518,425 B2
(45) Date of Patent: Apr. 14, 2009

(54) CIRCUIT AND TECHNIQUE FOR ADJUSTING AND ACCURATELY CONTROLLING CLOCK DUTY CYCLES IN INTEGRATED CIRCUIT DEVICES

(75) Inventor: John D. Heightley, Colorado Springs, CO (US)

(73) Assignee: ProMOS Technologies PTE.Ltd, Singapore (SG)

( * ) Notice: Subject to any disclaimer, the term of this patent is extended or adjusted under 35 U.S.C. 154(b) by 45 days.

(21) Appl. No.: 11/671,383

(22) Filed: Feb. 5, 2007

(65) Prior Publication Data
US 2008/0186068 A1    Aug. 7, 2008

(51) Int. Cl.
*H03K 3/017*    (2006.01)
(52) U.S. Cl. ...................... 327/175; 327/172
(58) Field of Classification Search .......... 327/170–175
See application file for complete search history.

(56) References Cited

U.S. PATENT DOCUMENTS

| | | | |
|---|---|---|---|
| 6,034,548 A * | 3/2000 | Churcher et al. | 326/49 |
| 6,525,569 B1 * | 2/2003 | Leon | 326/83 |
| 6,781,419 B2 | 8/2004 | Harrison | |
| 6,897,696 B2 * | 5/2005 | Chang | 327/175 |
| 6,975,100 B2 | 12/2005 | Doppke et al. | |
| 7,015,739 B2 | 3/2006 | Lee et al. | |
| 7,145,370 B2 * | 12/2006 | Bernard et al. | 327/112 |

* cited by examiner

*Primary Examiner*—Dinh T. Le
(74) *Attorney, Agent, or Firm*—William J. Kubida; Scott J. Hawranek; Hogan & Hartson LLP

(57) ABSTRACT

A circuit and technique for adjusting and accurately controlling clock duty cycles in integrated circuit devices in which only N-channel current regulating transistors are used in the voltage-controlled inverters and both the rising and falling edges can be adjusted by cascading two such inverters. The potential for cascading of these inverters allows for additional accuracy to be achieved.

31 Claims, 10 Drawing Sheets

CIRCUIT AND TECHNIQUE FOR ADJUSTING AND ACCURATELY CONTROLLING CLOCK DUTY CYCLES IN INTEGRATED CIRCUIT DEVICES

BACKGROUND OF THE INVENTION

The present invention relates, in general, to the field of integrated circuit devices. More particularly, the present invention relates to a circuit and technique for adjusting and accurately controlling clock duty cycles in integrated circuit devices such as, for example, double data rate synchronous dynamic random access memories (DDR SDRAMs).

It has become increasingly important in digital circuits that an accurate 50% duty cycle clock be generated since actions are taken on both the rising and falling edges of the clock. The use of a dual slope integrator scheme to indicate when a signal has a 50% duty cycle is known in the art. This scheme utilizes two current sources of equal magnitude, one to charge an integrating capacitor when the signal is "high" and the other to discharge the capacitor when the signal is "low". When the signal has a 50% duty cycle, there will be no net charge transferred to the capacitor during a clock cycle and the voltage on the capacitor will stabilize.

When the signal has a duty cycle greater than 50%, the voltage on the capacitor will increase. When the duty cycle is less than 50%, the voltage on the capacitor will decrease. The voltage on the capacitor can, in turn, be used to control the duty cycle; i.e., a "control voltage" is generated. In some cases, two control voltages have been generated, one utilizing the clock and one using the complement of the clock. In this case, the two control voltages move in opposite directions as the duty cycle diverges from 50%.

A number of different techniques have been proposed for using the above described control voltage to adjust the duty cycle. It is also known that using the same technique with current sources that are not equal can be used to generate signals with precise duty cycles other than 50%. Examples of the above listed techniques are described, for example, in U.S. Pat. Nos. 7,015,739; 6,781,419 and 6,975,100.

The duty cycle deviation is the result of the rising and falling edges of a 50% duty cycle input signal propagating at different rates through the circuitry intervening between the input and a point at which the propagated signal is used. A common approach used for adjusting the duty cycle is to add voltage-controlled duty cycle adjusting circuitry to the intervening path. The added duty cycle adjusting circuitry in this approach uses the control voltage(s) to cause the rising and falling edge propagation delays to differ in opposite directions to those of the circuitry between the input and the added duty cycle adjusting circuitry. Thus, the duty cycle is adjusted toward the desired value.

In U.S. Pat. No. 6,781,419 in particular, a voltage-controlled inverter is used to adjust the output slew rates of the rising and falling edges in opposite directions thus adjusting the duty cycle. A voltage-controlled current regulating P-channel transistor is used to control the inverter output rising edge slew rate. An N-channel voltage-controlled regulating transistor is used to control the inverter output falling edge slew rate. The control voltages used to control the P-channel and N-channel transistors are derived from the voltage generated by a dual slope integrator as described above rather than using this voltage directly.

The use of both P-channel and N-channel current regulation transistors in voltage-controlled inverters presents a problem in that both transistors require low threshold voltages if a dual slope integrator is to be used directly as the control voltage. Further, the control voltage generated using a dual slope integrator is conventionally not used directly. Rather, control voltages are derived from this voltage thus necessitating additional circuit complexity.

SUMMARY OF THE INVENTION

Disclosed herein is a circuit and technique for adjusting and accurately controlling clock duty cycles in integrated circuit devices in which only N-channel current regulating transistors are used in the voltage-controlled inverters and both the rising and falling edges can be adjusted by cascading two such inverters. The potential for cascading multiple pairs of inverters allows for additional accuracy to be achieved.

Disclosed herein is a duty cycle correcting circuit which comprises an even number of identical voltage-controlled inverters cascaded with two different control voltages applied to the even and odd inverters respectively. This duty cycle correcting circuit may be implemented with the two different control voltages initialized to one-half of the power supply voltage. In a particular embodiment disclosed herein the duty cycle correcting circuit may be implemented using only an N-channel current controlled transistor in the voltage-controlled inverter and which has said inverter falling edge slew rate and switching point controlled by the applied control voltage. As further disclosed herein, each control voltage may be generated using a single bi-directional current path in separate dual slope integrator voltage generators.

Particularly disclosed herein is a duty cycle adjusting circuit which comprises first and second voltage-controlled inverters coupled between a supply voltage source and a reference voltage level. The first voltage-controlled inverter receives a first control voltage at an input thereof and the second voltage-controlled inverter receives a second control voltage at an input thereof. The first and second control voltages move in opposite directions as an output of the circuit diverges from a 50% duty cycle. In a particular implementation, a plurality of voltage-controlled inverters, functioning as a duty cycle adjuster, may be coupled in cascade with the first and second voltage-controlled inverters with odd numbered ones receiving the first control voltage and even numbered ones receiving the second control voltage.

Also particularly disclosed herein is a duty cycle adjuster circuit which comprises a first voltage-controlled inverter receiving an input clock signal and a first control voltage and a second voltage-controlled inverter coupled to an output of the first voltage-controlled inverter and receiving a second control voltage. The second voltage-controlled inverter provides a corrected output clock signal in response to the output of said first voltage-controlled inverter and the second control voltage.

Also further particularly disclosed herein is a method for adjusting the duty cycle of an input signal which comprises providing first and second series coupled inverters, firstly adjusting a propagation delay of a rising edge of the input signal with the first inverter and secondly adjusting a propagation delay of a falling edge of the input signal with the second inverter. The adjustment of the propagation delays may be effectuated by adjusting the slew rate of the falling edge of an output of each inverter. By also supplying respective first and second control signals to the first and second inverters their switching thresholds may be adjusted resulting in an effective duty cycle adjustment to the input signal.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A REPRESENTATIVE EMBODIMENT

Figure 1:
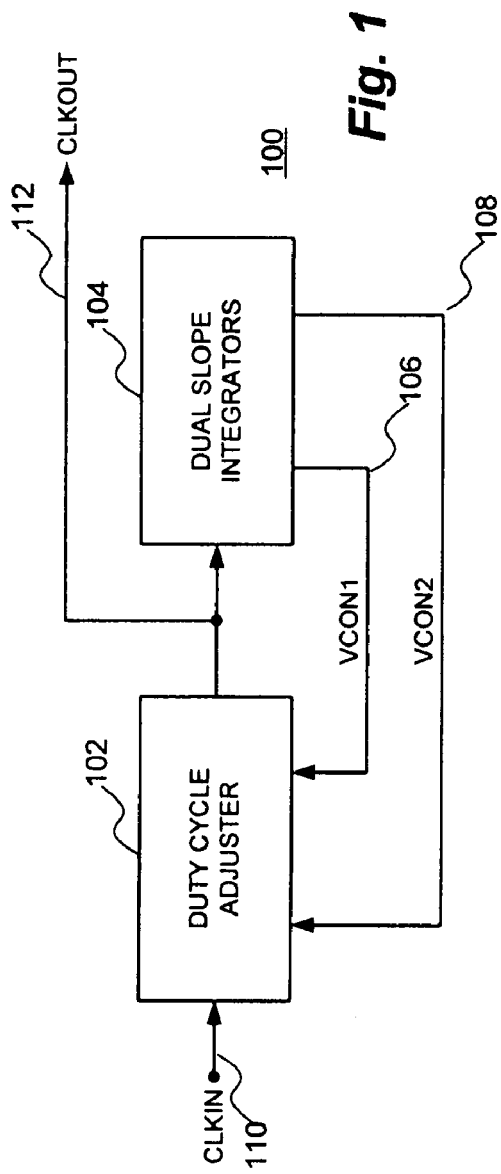
FIG. 1 is a simplified block diagram of a duty cycle correction circuit in accordance with an embodiment of the present invention for adjusting and accurately controlling clock duty cycles in integrated circuit devices.

With reference now to FIG. 1, a simplified block diagram of a duty cycle correction circuit 100 in accordance with an embodiment of the present invention is shown for adjusting and accurately controlling clock duty cycles in integrated circuit devices. The circuit 100 comprises a voltage-controlled duty cycle adjusting circuit, or duty cycle adjuster 102 which receives a clock input signal (CLKIN) on line 110 and provides a corrected clock output signal (CLKOUT) on line 112. The duty cycle adjuster 102 will be described more fully hereinafter.

The CLKOUT signal is also provided as input to dual slope integrators 104 which will also be more fully described hereinafter. The dual slope integrators 104 generate control voltages VCON1 and VCON2 on lines 106 and 108 respectively which are provided to the duty cycle adjuster 102.

Figure 2:
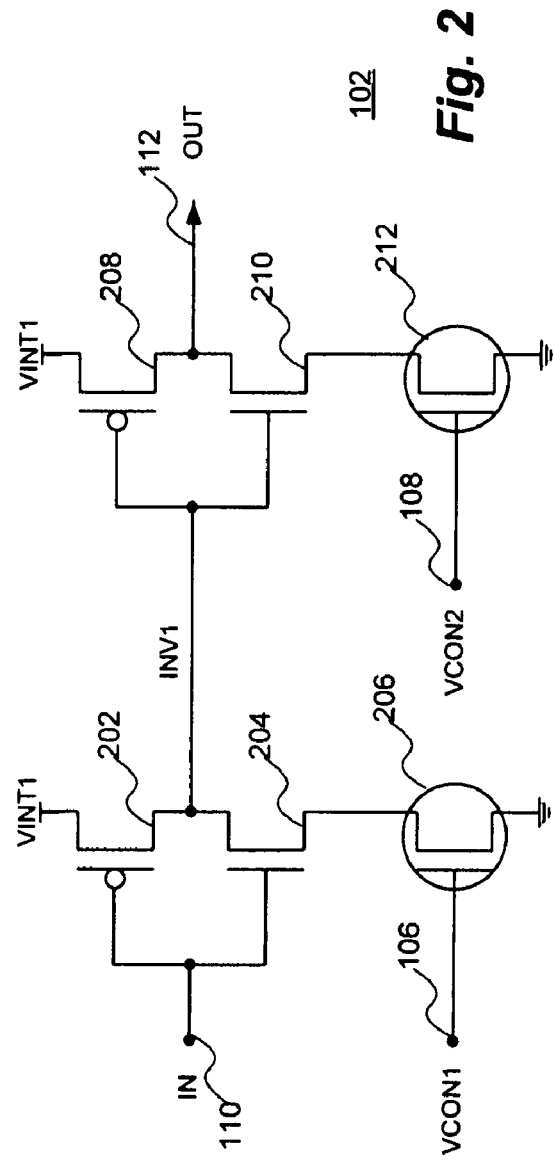
FIG. 2 is a detailed schematic illustration of an implementation of the duty cycle adjuster of the preceding figure.

With reference additionally now to FIG. 2, a detailed schematic illustration of an implementation of the voltage-controlled duty cycle adjusting circuit, or duty cycle adjuster 102, of the preceding figure is shown. The duty cycle adjuster 102 includes a first inverter comprising series connected P-channel transistor 202 and N-channel transistor 204 coupled in series with an N-channel current regulating transistor 206. The common connected gates of transistors 202 and 204 receive the input signal IN (CLKIN in FIG. 1) while the gate of the current regulating transistor 206 receives the control voltage VCON1.

Similarly, the duty cycle adjuster 102 also comprises another inverter comprising series connected P-channel transistor 208 and N-channel transistor 210 coupled in series with another N-channel current regulating transistor 212. The common connected gates of transistors 208 and 210 receive the output of the first inverter (INV1) while the gate of the current regulating transistor 212 receives the control voltage VCON2. Output of the duty cycle adjuster is provided on line 112 as shown.

Multiple instances of the duty cycle adjuster 102 can be cascaded to improve the performance of the overall correcting circuit 100. As previously described, the duty cycle adjuster 102 comprises two identical voltage-controlled inverters cascaded. The inverters use only an N-channel current regulating transistor 206, 212 to control the slew rate of the falling edge output of the individual inverters. The slew rate of the rising edge output of the individual inverters is not adjusted. The first inverter of the pair allows adjustment of the propagation delay of the rising edge of the signal IN on line 110 by adjusting the slew rate of the falling edge of its output. The second inverter of the pair allows adjustment of the falling edge of the signal IN. Since the input to the second inverter is inverted with respect to the signal IN, adjusting the slew rate of the falling edge of its output allows the propagation delay of the falling edge of the signal IN on line 110 to be adjusted.

In addition to controlling the falling edge slew rate of the voltage-controlled inverters, the control voltages VCON1 and VCON2 also adjusts the switching threshold of the inverters. This also causes the duty cycle to be adjusted because of the cascading of the inverters. As an example, if the control voltage VCON1 to the first inverter is reduced, the falling edge slew rate of the inverter is reduced and the propagation delay of the rising edge of the signal IN on line 110 is increased. As the control voltage VCON1 is reduced, the switching threshold of the inverter is raised which also causes the propagation delay of the rising edge of the IN signal to increase. If the control voltage is increased, the opposite effects occur and the propagation delay of the rising edge inputs is reduced. The second cascaded inverter responds in a similar way in response to control voltage VCON2.

Two control voltages, VCON1 and VCON2 that move in opposite directions as the duty cycle diverges from 50% are used as separate inputs to the two inverters on lines 106 and 108 respectively. Thus, the propagation delays of the rising and falling edges of the input signal IN will move in opposite directions as they propagate through the duty cycle adjuster 102 and the duty cycle will be corrected.

The control voltages VCON1 and VCON2 can be generated using two dual slope integrators as will be more fully described hereinafter. As discussed above, one of the integrators uses the signal that is to have 50% duty cycle as its input and the second integrator uses a signal that is 180 degrees out of phase with this signal as its input. In this manner, as one control voltage decreases when the signal is greater than 50% duty cycle, the second control voltage will increase and vice-versa when the duty cycle is less than 50%. These control voltages can be used directly by the duty cycle adjuster 102.

Figure 3:
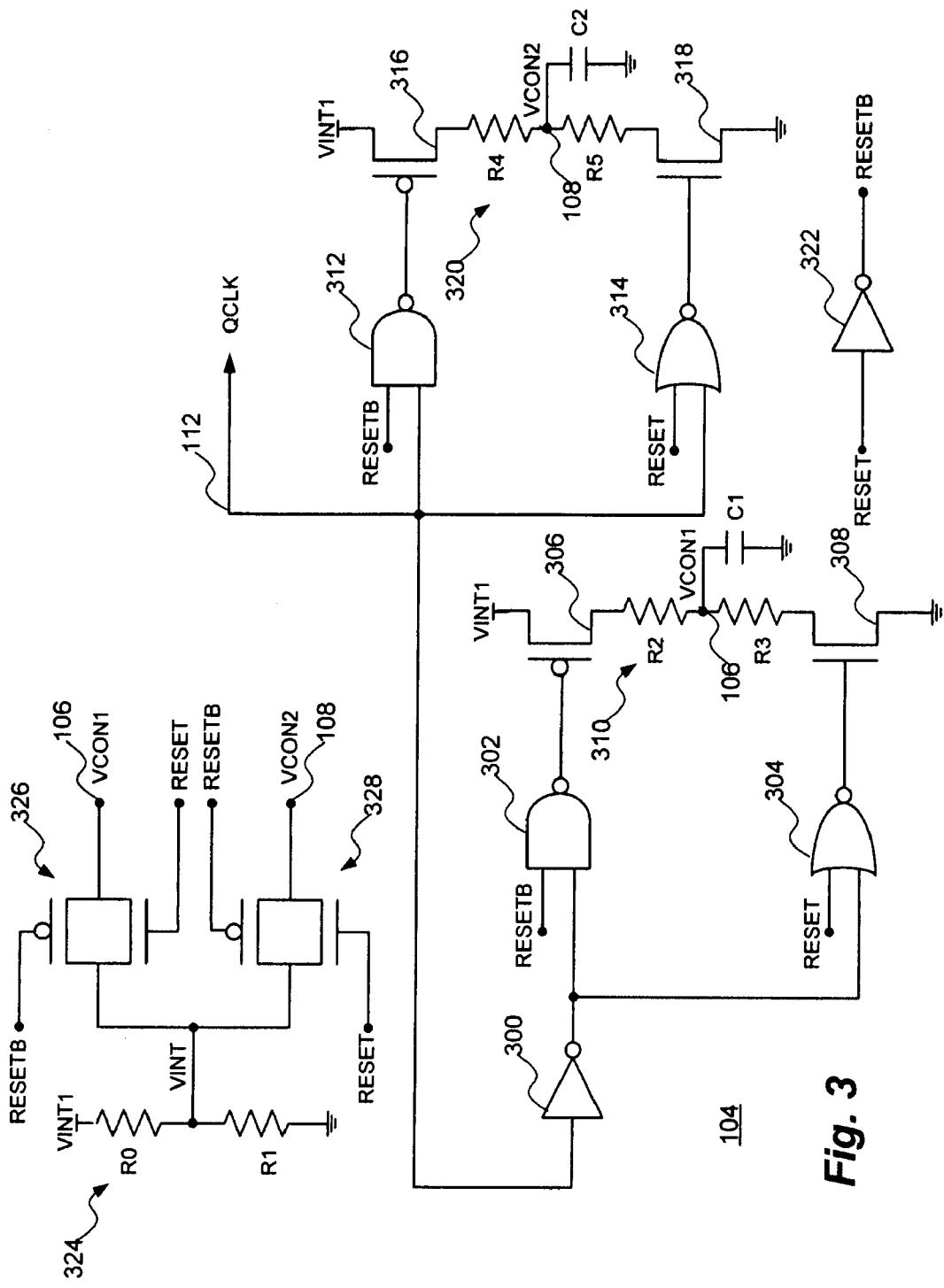
FIG. 3 is a detailed schematic illustration of a control voltage generation circuit comprising the dual slope integrators of FIG. 1.

With reference additionally now to FIG. 3, a detailed schematic illustration of a control voltage generation circuit comprising one possible embodiment of the dual slope integrators 104 of FIG. 1 is shown. The first of the dual slope integrators 104 comprises an inverter 300 having its input connected to line 112, QCLK, (CLKOUT in FIG. 1) and its output connected to one input of two-input NAND gate 302. The other input of NAND gate 302 receives a RESETB (RESET Bar) signal as shown.

The output of the inverter 300 is also provided to one input of two-input NOR gate 304, the other input of which receives a RESET signal. Output of the NAND gate 302 is provided to the gate terminal of a P-channel transistor 306 which has its source coupled to receive a supply voltage VINT1 and its drain coupled to a resistor R2. The output of the NOR gate 304 is, in turn, connected to the gate terminal of an N-channel transistor 308 which has its source terminal connected to a reference voltage level (VSS, or circuit ground) and its drain terminal coupled to a resistor R3. The node intermediate resistors R2 and R3 defines line 106 for providing the control voltage VCON1 and is coupled to VSS through integrating capacitor C1. The resistors R2 and R3 function as a portion of a first pair of current sources 310.

Similarly, the second of the dual slope integrators 104 also comprises another two-input NAND gate 312 which has one input coupled to receive the output of the duty cycle adjuster 102, QCLK, (CLKOUT in FIG. 1) and the other input connected to receive the RESETB signal. An additional two-input NOR gate 314 also receives the output of the duty cycle adjuster 102 while its other input receives the RESET signal.

Output of the NAND gate 312 is provided to the gate terminal of a P-channel transistor 316 which has its source coupled to receive the supply voltage VINT1 and its drain coupled to a resistor R4. The output of the NOR gate 314 is, in turn, connected to the gate terminal of an N-channel transistor 318 which has its source terminal connected to VSS and its drain terminal coupled to a resistor R5. The node intermediate resistors R4 and R5 defines line 108 for providing the second control voltage VCON2 and is coupled to VSS through integrating capacitor C2. The resistors R4 and R5 function as a portion of another pair of current sources 320.

Also illustrated is a single inverter 322 which functions to provide the complementary signal RESETB in response to the input of the RESET signal. The dual slope integrators 104 also comprises a voltage divider 324 implemented as series connected resistors R0 and R1 coupled between VINT1 and VSS. The node intermediate the resistors R0 and R1 (VINT) is provided as input to first and second complementary metal oxide semiconductor (CMOS) transmission gates 326 and 328 which have their respective outputs coupled to lines 106 and 108 in accordance with the state of the RESET and RESETB signals as shown. When the values of R0 and R1 are substantially equal, this serves to initialize the control voltages VCON1 and VCON2 to a level of VINT1/2.

As previously mentioned, the current sources are implemented as large value resistors R2/R3 and R4/R5 that are selectively coupled between the integrating capacitors C1 and C2 respectively and the power supply VINT1 or ground respectively. The voltage on the capacitors C1 and C2 is initialized to one-half the power supply voltage with the signal RESET "high". After RESET goes "low", the pull-up current on the right-hand integrator is turned "on" and the pull-down current is turned "off" when the signal QCLK on line 112 is "high". The behavior of the left-hand integrator is exactly the opposite. Thus, the voltages on the capacitors C1 and C2 move in opposite directions in response to the signal QCLK on line 112 as the duty cycle diverges from 50%. Since the resistor/transistor combinations in the particular implementation shown are not perfect current sources, there will be some residual duty cycle offset when the voltages on the capacitors C1 and C2 stabilize. By minimizing the voltage drop across the transistors and having the voltage stabilize as close to one-half the power supply voltage VINT1 as possible, the pull-up and pull-down currents will be closer in magnitude.

Minimizing the drop across the transistors can be achieved by proper sizing of the transistors relative to the resistance of the resistors. Since the voltages across the capacitors C1 and C2 are set by the requirement of the adjusting circuit, they cannot be independently set. However, by cascading multiple duty cycle adjusters 102 (FIG. 2), the excursions away from the initialized values can be reduced since the adjustment per circuit stage will have to be less.

Figure 4:
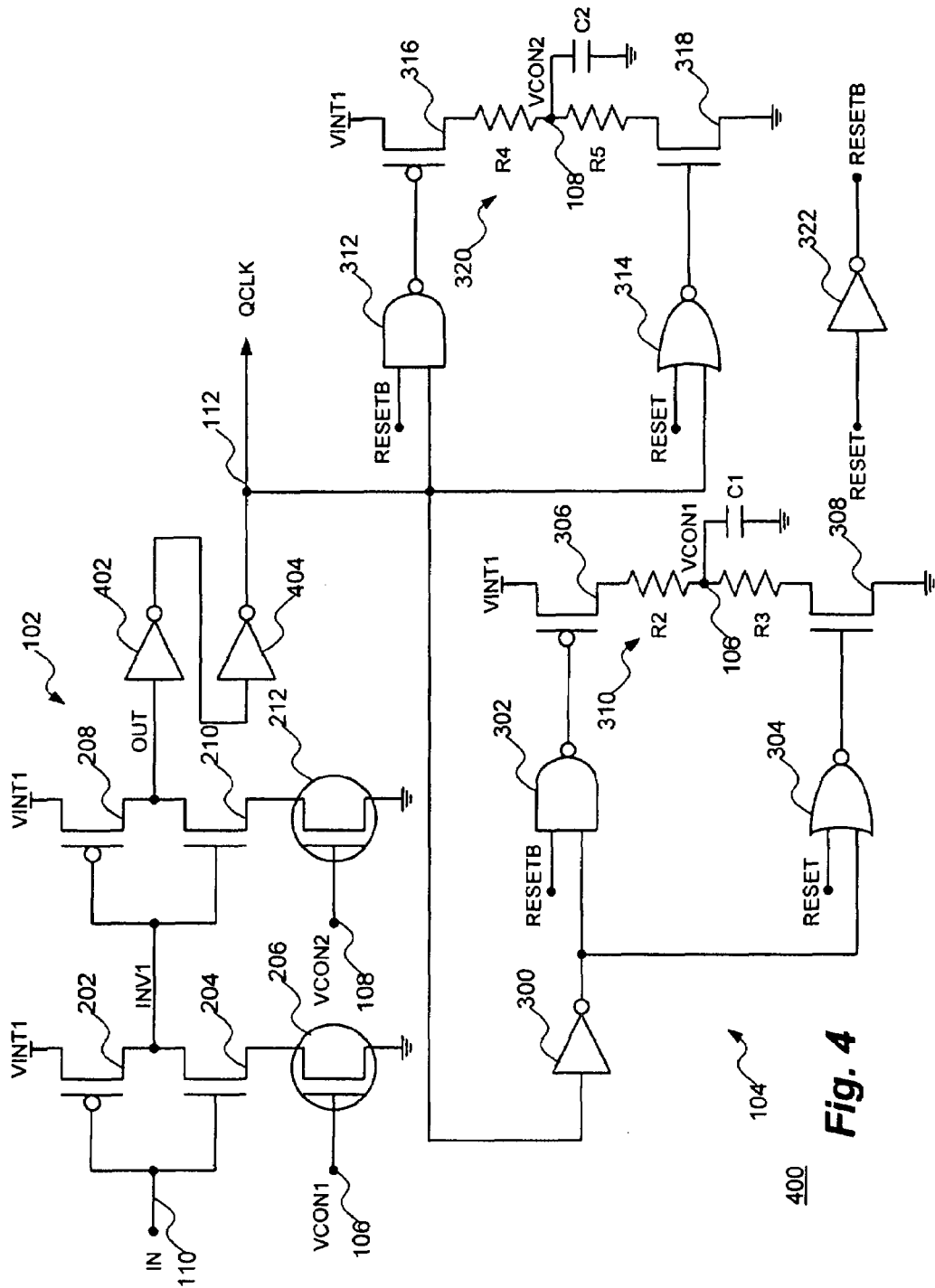
FIG. 4 is a detailed schematic illustration of the combined duty cycle adjuster of FIG. 2 and the control voltage generation circuit of the preceding figure wherein the signal QCLK is the corrected output clock signal.

With reference additionally now to FIG. 4, a detailed schematic illustration of the combined duty cycle adjuster 102 of FIG. 2 and the control voltage generation circuit, or dual slope integrators 104, of the preceding figure is shown wherein the signal QCLK on line 112 is the corrected output clock signal. The circuit 400 illustrated is equivalent to that illustrated in the simplified block diagram of FIG. 1 and like structure to that previously described with respect to the preceding figures is like numbered and the description thereof shall suffice herefor. The circuit 400 illustrated illustrates only the addition of two series connected inverters 402 and 404 coupled between the output of the duty cycle adjuster 102 of FIG. 2 and the dual slope integrators 104 of FIG. 3. Multiple pairs of cascaded inverters in the adjusting circuit will improve the performance, but only one pair is shown for simplicity. The inverters 402 and 404 function as a representative output buffering circuit and, as before, the signal QCLK is the corrected output clock signal.

Figure 5:
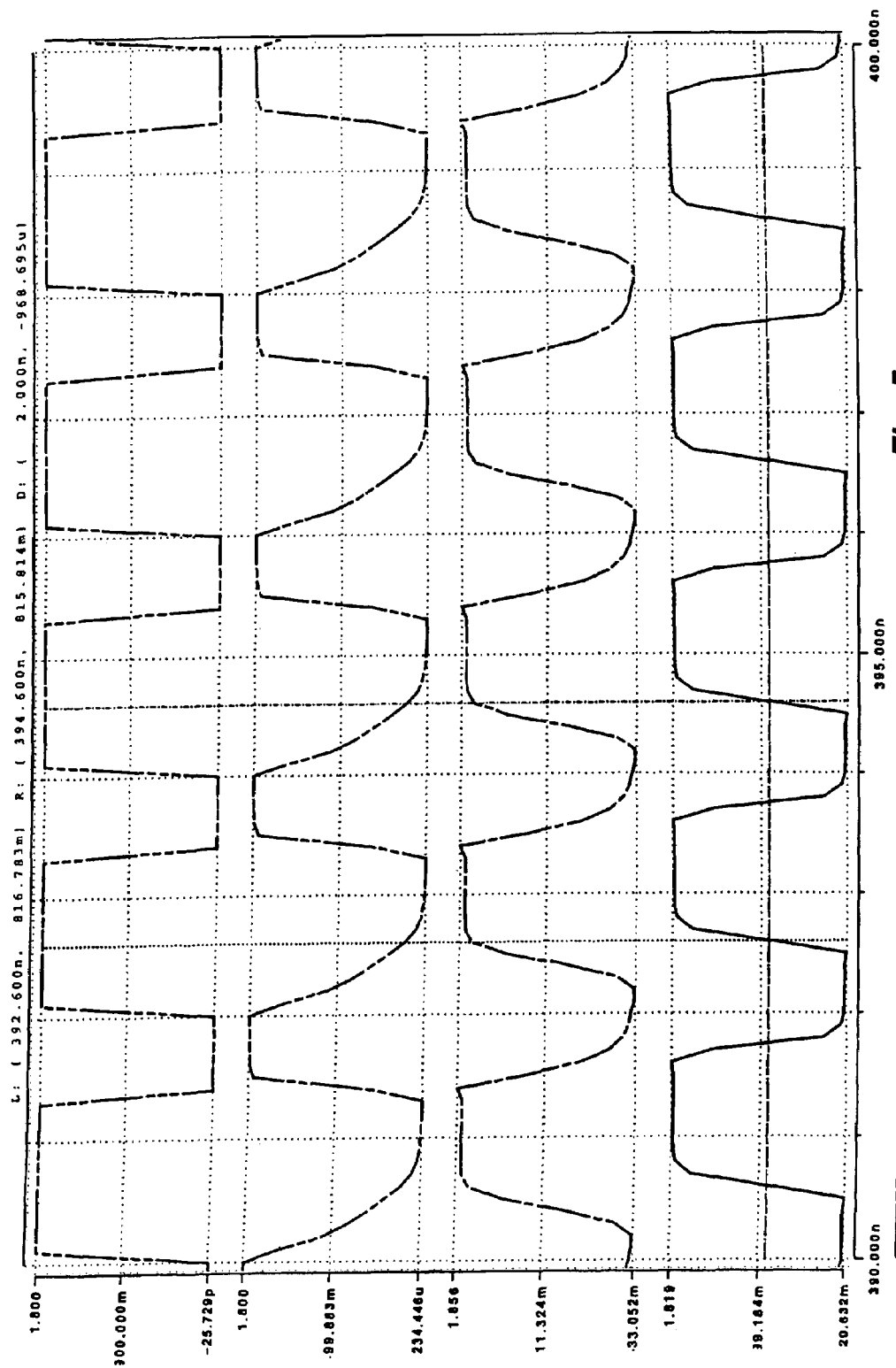
FIG. 5 is a series of waveforms illustrative of a simulation of the circuit of the preceding figure with an input clock period of 2 ns and a duty cycle of 65%.

With reference additionally now to FIG. 5, a series of waveforms illustrative of a simulation of the circuit 400 of the preceding figure is shown with an input clock period of 2 ns and a duty cycle of 65%. The signals CLK, INV1, OUT and QCLK are illustrated in descending order. It should be noted that the fall time on the node INV1 (FIG. 4) is increased compared to the fall time on node OUT (FIG. 4) of the duty cycle adjuster 102 and the duty cycle of the signal QCLK on line 112 (FIG. 4) is reduced to 57%.

Figure 6:
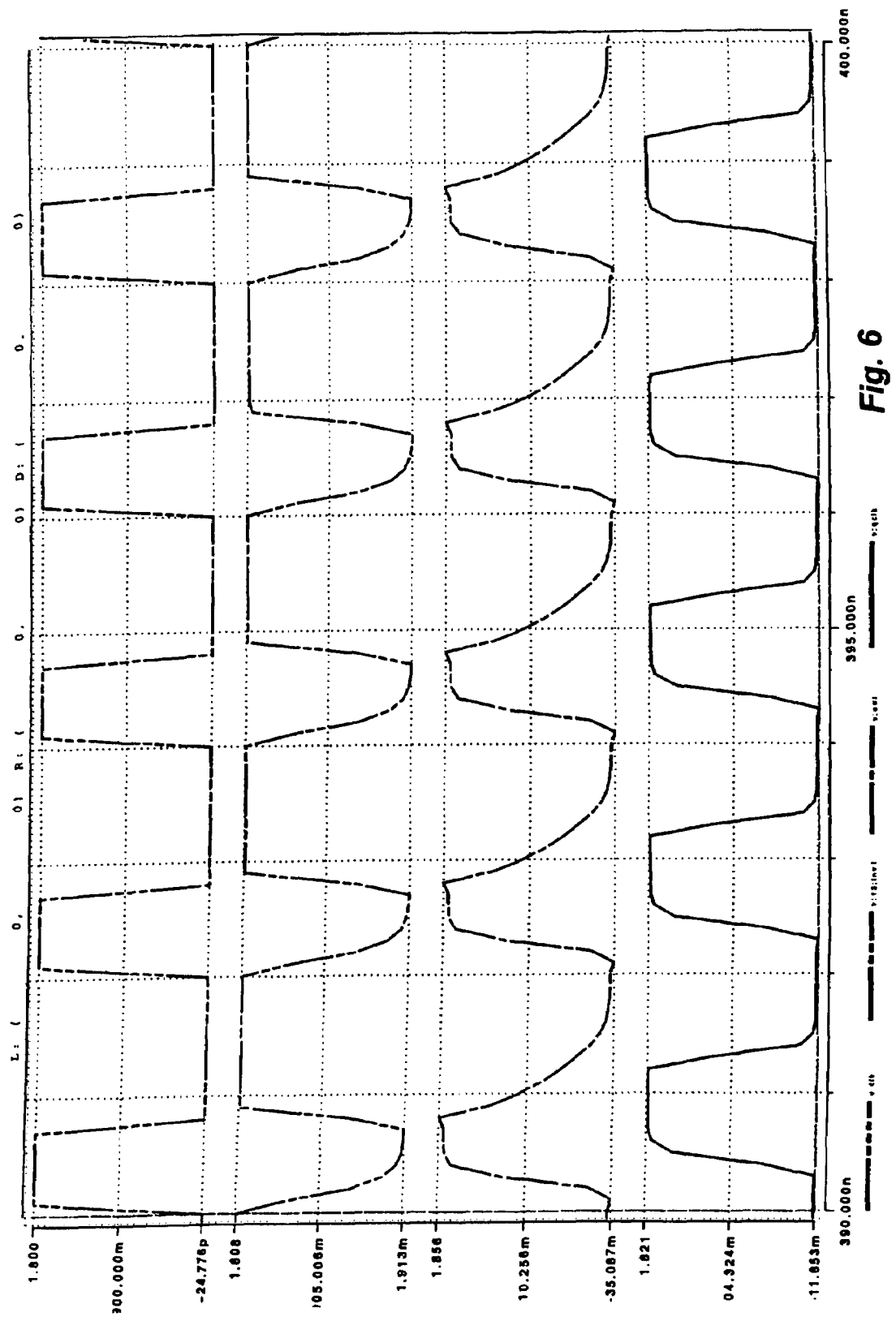
FIG. 6 is another series of waveforms illustrative of a further simulation of the circuit of FIG. 4 with an input duty cycle of 35%.

With reference additionally now to FIG. 6, another series of waveforms illustrative of a further simulation of the circuit of FIG. 4 is shown with an input duty cycle of 35%. Again, the signals CLK, INV1, OUT and QCLK are illustrated. With respect to this figure, it should be noted that the fall time of node OUT (FIG. 4) is increased compared to that of node INV1 and the duty cycle of QCLK (FIG. 4) is increased to 44.6%.

Figure 7:
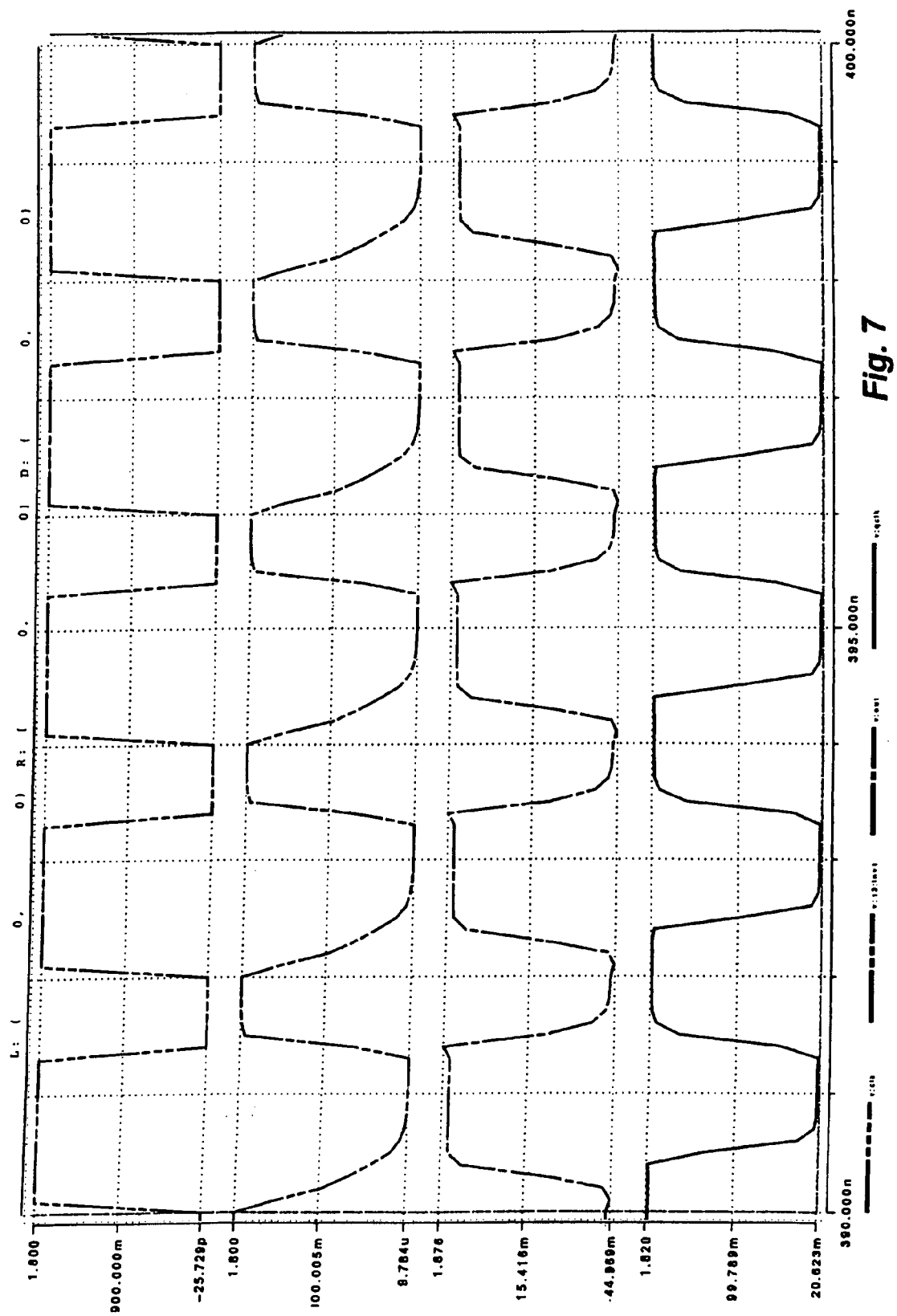
FIG. 7 is yet another series of waveforms illustrative of another simulation of the circuit of FIG. 4 with a duty cycle of 65% and having four instances of the adjusting circuit cascaded.

With reference additionally now to FIG. 7, yet another series of waveforms illustrative of another simulation of the circuit of FIG. 4 is shown with a duty cycle of 65% and having four instances of the duty cycle adjuster 102, or adjusting circuit, cascaded. As before, the signals CLK, INV1, OUT and QCLK are illustrated and only the waveforms for the first instance are shown for ease of comparison. It should be noted that the fall time of node INV1 (FIG. 4) is again increased relative to node OUT (FIG. 4) but the increase is substantially less than for the single instance case shown in FIG. 5 and the duty cycle of the signal QCLK has been reduced to 52.8%. If eight stages of the duty cycle adjuster 102 for a 65% duty cycle input signal of FIG. 2 are cascaded, the duty cycle is reduced to 51.8%.

Figure 8:
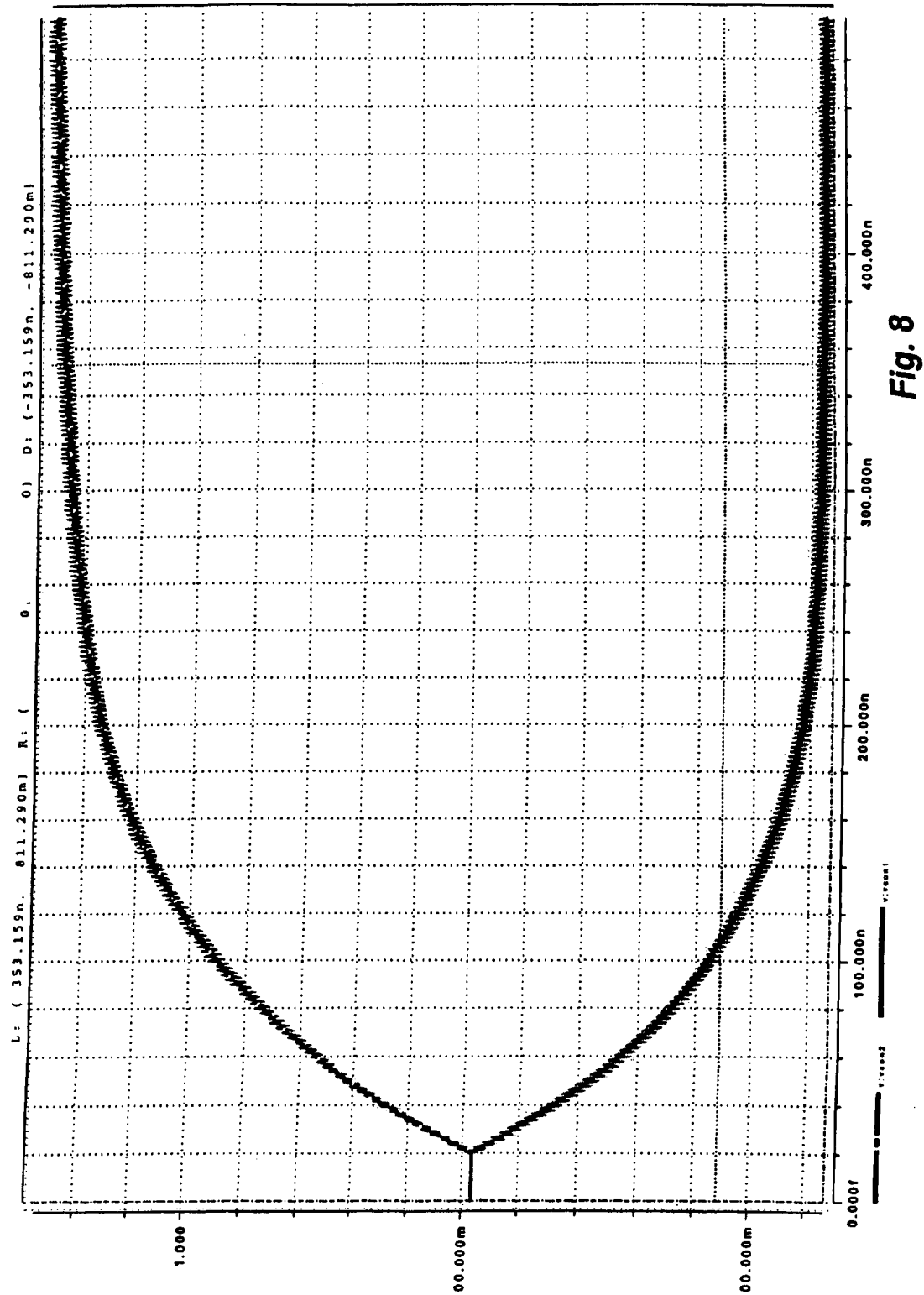
FIG. 8 is a graphic illustration of the control voltages VCON1 and VCON2 in a simulation of the circuit of FIG. 4 with a single instance of the adjusting circuit and an input duty cycle of 65%.

With reference additionally now to FIG. 8, a graphic illustration of the control voltages VCON1 and VCON2 is shown in a simulation of the circuit of FIG. 4 with a single instance of the duty cycle adjuster 102 for a 65% duty cycle input signal.

Figure 9:
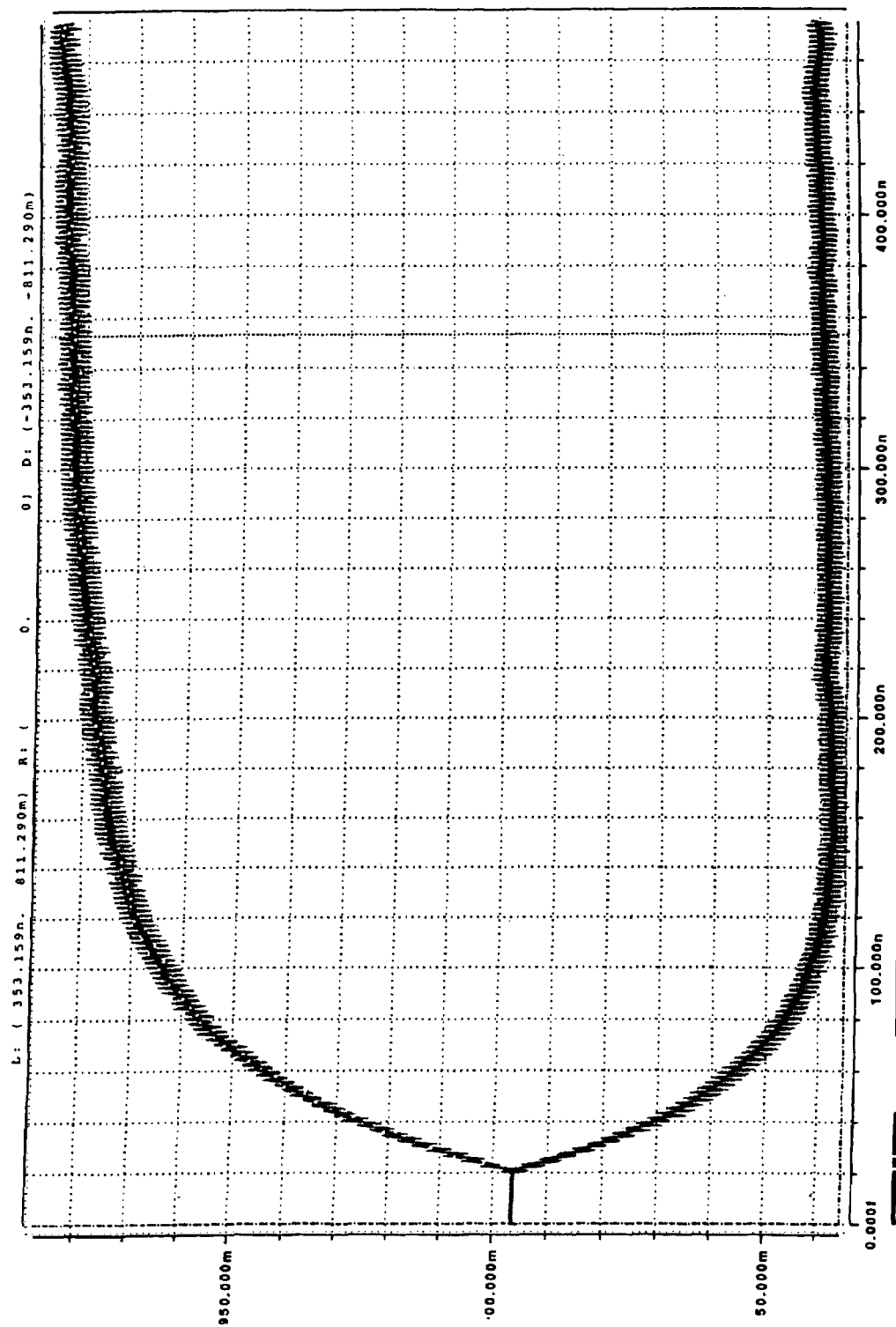
FIG. 9 is a further graphic illustration of the control voltages VCON1 and VCON2 in a simulation of the circuit of FIG. 4 with four instances of the adjusting circuit and an input duty cycle of 65%.

With reference additionally now to FIG. 9, a further graphic illustration of the control voltages VCON1 and VCON2 is shown in a simulation of the circuit of FIG. 4 with four instances of the duty cycle adjuster 102.

With respect to FIGS. 8 and 9, in the case of the single instance of the duty cycle adjuster 102 in the former figure, the control voltages have diverged by −120 mV and +125 mV respectively. In the case of the four instances in the latter figure, the control voltages have diverged by −55 mV and +80 mV respectively. In the case of eight instances of the duty cycle adjuster 102 (not shown), the control voltages would diverge by −31 mV and +60 mV respectively.

Figure 10:
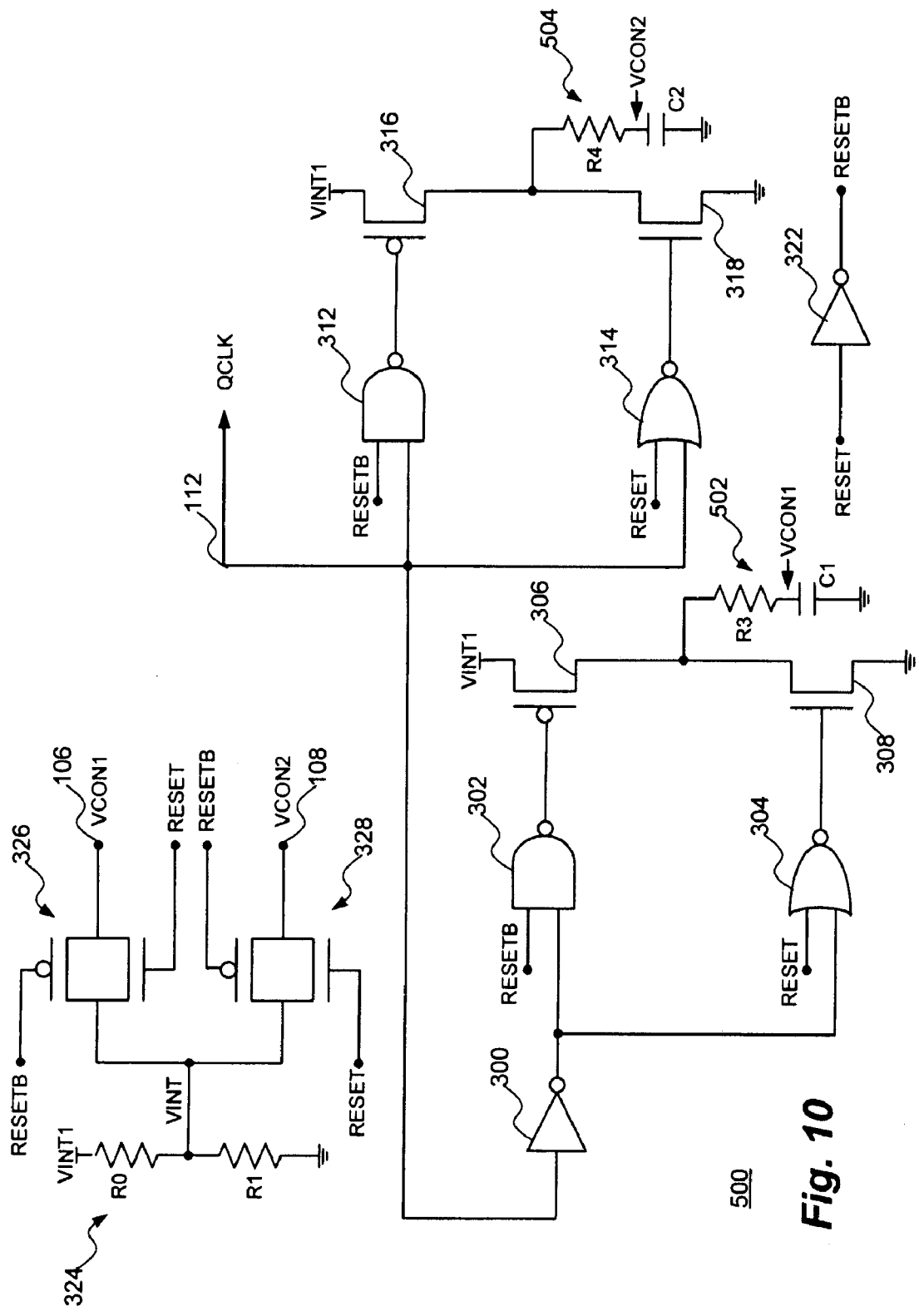
FIG. 10 is an alternative embodiment of a control voltage generation circuit of particular utility where only 50% duty cycles are required allowing a single resistor to be used in place of separate pull-up and pull-down resistors as in the embodiment of FIG. 3.

With reference additionally now to FIG. 10, an alternative embodiment of a control voltage generation circuit 500 is shown which is of particular utility where only 50% duty cycles are required thereby allowing a single resistor to be used in place of separate pull-up (R2 and R4) and pull-down (R3 and R5) resistors as shown in the embodiment of FIG. 3.

With respect to the circuit 500, like structure to that previously described with respect to the preceding figures is like numbered and the description thereof shall suffice herefor. This embodiment utilizes a single resistor/capacitor (RC) circuit 502 comprising resistor R3 and capacitor C1 in the first stage and a single RC circuit 504 comprising resistor R4 and capacitor C2 in the second stage.

As previously illustrated with respect to FIG. 3, if the pull-up and pull-down resistors have different values, the duty cycle can be adjusted to values other than 50%. However, if only 50% duty cycles are required, the pull-up and pull-down resistors can be combined into a single resistor (e.g. R3 and R4) between the integrating capacitor (C1 and C2) and the junction between the P-channel pull-up transistor (306 and 316) and the N-channel pull-down transistor (308 and 318) as shown.

Figure 11:
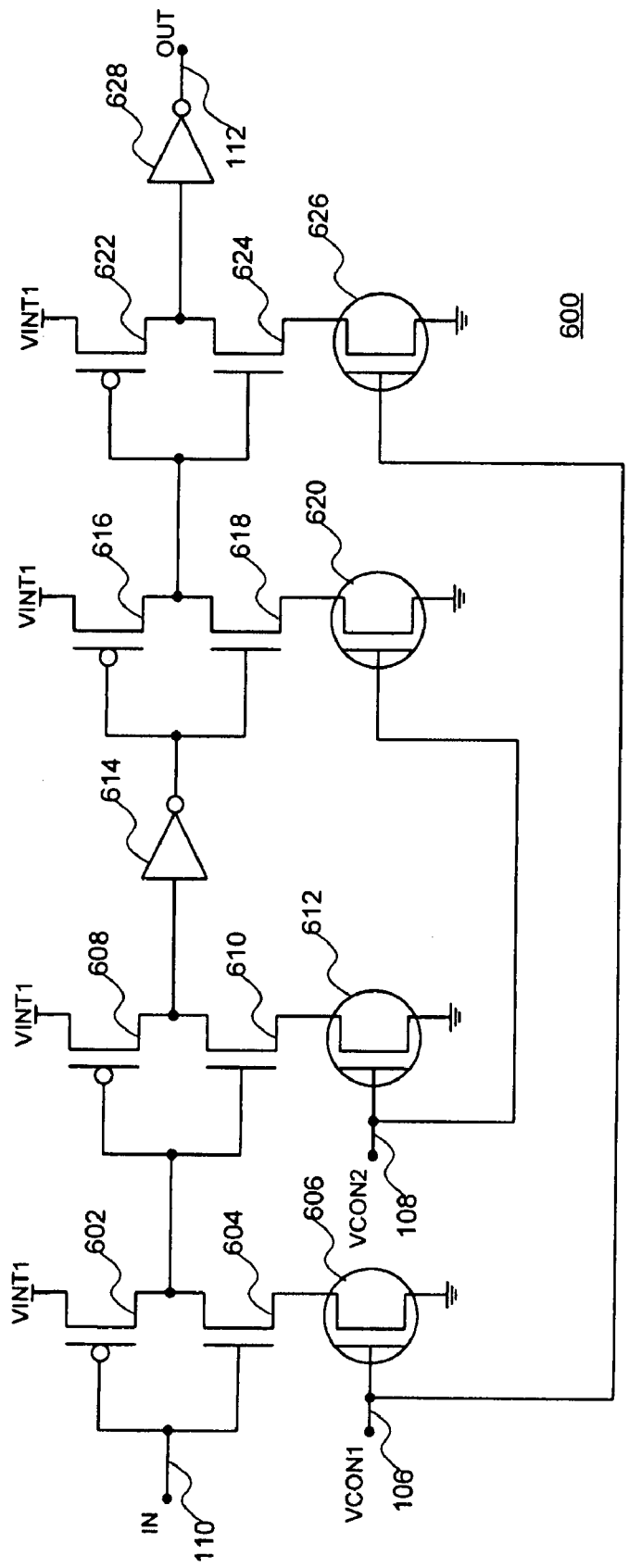
FIG. 11 is an alternative embodiment of a duty cycle adjusting circuit implemented utilizing two of the duty cycle adjusters of FIG. 2 in cascade but with an inversion between the two stages and an inverter at the output.

With reference additionally now to FIG. 11, an alternative embodiment of a duty cycle adjusting circuit 600 is shown implemented utilizing two of the duty cycle adjusters 102 of FIG. 2 in cascade but with an inverter 614 between the two stages and an inverter 628 at the output. Like input and output signals are like numbered and transistors 602, 604, 606, 608, 610 and 612 in FIG. 11 correspond directly with transistors 202, 204, 206, 208, 210 and 212 in FIG. 2. In like manner, transistors 616, 618, 620, 622, 624 and 626 in FIG. 11 also correspond directly with transistors 202, 204, 206, 208, 210 and 212 in FIG. 2. The VCON1 control voltage at the gate of transistor 606 is also coupled to the gate of transistor 626 while the VCON2 control voltage at the gate of transistor 612 is likewise coupled to the gate of transistor 620.

In some situations, it is possible that the duty cycle adjusting circuit 102 of FIG. 2 can itself introduce duty cycle variations that will add to the overall duty cycle correction that might be required. This possibility arises because the stage one rising delay (S1R) plus the stage two falling delay (S2F) will not exactly match the stage one falling delay (S1F) plus the stage two rising delay (S2R). This effect can be reduced by using two of the circuits 102 of FIG. 2 in cascade, but with an inversion (inverter 614) between the two stages. If the individual inverter stage delays in the first circuit substantially match those in the second circuit, the rising and falling edge propagation delays will be:

Rising Delay=$S1R+S2F+S1F+S2R$

Falling Delay+$S1F+S2R+S1R+S2F$

Thus, no duty cycle error is added.

Only the propagation delay of a rising edge input to any of the inverters can be controlled because only the pull-down of the inverter is controlled. Further, a rising edge input to the first inverter of the first corrector will become a rising edge to the second inverter in the second corrector. Therefore, the control voltage connections in the second corrector must be reversed vis-à-vis the connections in the first corrector. As shown in FIG. 11, the inverter 628 at the output of the second corrector stage is added to avoid inverting the signal as it passed through the corrector and it buffers the output. As previously disclosed herein, these correctors can also be cascaded to improve performance.

While there have been described above the principles of the present invention in conjunction with specific device types and circuit implementations, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

As used herein, the terms "comprises", "comprising", or any other variation thereof, are intended to cover a non-exclusive inclusion, such that a process, method, article, or apparatus that comprises a recitation of certain elements does not necessarily include only those elements but may include other elements not expressly recited or inherent to such process, method, article or apparatus. None of the description in the present application should be read as implying that any particular element, step, or function is an essential element which must be included in the claim scope and THE SCOPE OF THE PATENTED SUBJECT MATTER IS DEFINED ONLY BY THE CLAIMS AS ALLOWED. Moreover, none of the appended claims are intended to invoke paragraph six of 35 U.S.C. Sect. 112 unless the exact phrase "means for" is employed and is followed by a participle.

What is claimed is:

1. A duty cycle adjusting circuit comprising:
   first and second cascaded voltage-controlled inverters coupled between a supply voltage source and a reference voltage level, said first voltage-controlled inverter receiving a first control voltage at an input thereof and said second voltage-controlled inverter receiving a second control voltage at an input thereof, a magnitude of said first and second control voltages being adjusted to vary in opposite directions as an output of said circuit diverges from a 50% duty cycle.

2. The circuit of claim 1 wherein as said output of said circuit is greater than a 50% duty cycle, said first control voltage decreases and said second control voltage increases.

3. The circuit of claim 1 wherein as said output of said circuit is less than a 50% duty cycle, said first control voltage increases and said second control voltage decreases.

4. The circuit of claim 1 further comprising third and fourth voltage-controlled inverters coupled in cascade with said first and second cascaded voltage-controlled inverters, odd numbered ones of said voltage-controlled inverters receiving said first control voltage and even numbered ones of said voltage-controlled inverters receiving said second control voltage.

5. The circuit of claim 4 further comprising a plurality of voltage-controlled inverters coupled in cascade with said first and second cascaded voltage-controlled inverters, odd numbered ones of said plurality of voltage-controlled inverters receiving said first control voltage and even numbered ones of said plurality of voltage-controlled inverters receiving said second control voltage.

6. The circuit of claim 1 wherein said first and second control voltages are initialized to substantially one half of said supply voltage.

7. The circuit of claim 1 wherein each of said first and second voltage-controlled inverters comprise an N-channel current controlled transistor.

8. The circuit of claim 7 wherein each of said first and second voltage-controlled inverters further comprise series coupled P-channel and N-channel transistors in series with said N-channel current controlled transistor coupled between said supply voltage source and said reference voltage level.

9. The circuit of claim 1 wherein a switching point of each of said first and second voltage-controlled inverters is controlled by said respective first and second control voltages.

10. The circuit of claim 1 wherein said first and second control voltages are each generated by a single bi-directional current path in a dual slope integrator voltage generator.

11. A duty cycle adjuster circuit comprising:
a first voltage-controlled inverter receiving an input clock signal and a first control voltage; and
a second voltage-controlled inverter coupled to an output of said first voltage-controlled inverter and receiving a second control voltage, said second voltage-controlled inverter providing a corrected output clock signal in response to said output of said first voltage-controlled inverter and said second control voltage,
wherein a magnitude of said first and second control voltages is adjusted to vary in opposite directions as said corrected output clock signal diverges from a 50% duty cycle.

12. The circuit of claim 11 wherein as said corrected output clock signal exhibits a duty cycle greater than 50%, said first control voltage decreases and said second control voltage increases.

13. The circuit of claim 11 wherein as said corrected output clock signal exhibits a duty cycle lass than 50%, said first control voltage increases and said second control voltage decreases.

14. The circuit of claim 11 further comprising third and fourth voltage-controlled inverters coupled in cascade with said first and second voltage-controlled inverters, odd numbered ones of said voltage-controlled inverters receiving said first control voltage and even numbered ones of said voltage-controlled inverters receiving said second control voltage.

15. The circuit of claim 14 further comprising a plurality of voltage-controlled inverters coupled in cascade with said first and second voltage-controlled inverters, odd numbered ones of said plurality of voltage-controlled inverters receiving said first control voltage and even numbered ones of said plurality of voltage-controlled inverters receiving said second cascaded control voltage.

16. The circuit of claim 11 wherein said first and second control voltages are initialized to substantially one half of a supply voltage.

17. The circuit of claim 11 wherein each of said first and second voltage-controlled inverters comprise an N-channel current controlled transistor.

18. The circuit of claim 17 wherein each of said first and second cascaded voltage-controlled inverters further comprise series coupled P-channel and N-channel transistors in series with said N-channel current controlled transistor.

19. The circuit of claim 11 wherein a switching point of each of said first and second voltage-controlled inverters is controlled by said respective first and second control voltages.

20. The circuit of claim 11 wherein said first and second control voltages are each generated by a single bi-directional current path in a dual slope integrator voltage generator.

21. A method for adjusting the duty cycle of an input signal comprising:
providing first and second series coupled inverters;
firstly adjusting a propagation delay of a rising edge of said input signal with said first inverter;
secondly adjusting said propagation delay of a falling edge of said input signal with said second inverter;
supplying respective first and second control signals to said first and second inverters;
adjusting a switching threshold of said first and second inverters in response to said control signals; and
reducing a magnitude of said first control signal to reduce said falling edge slew rate of said first inverter and increasing a magnitude of said second control signal to increase a filling edge slew rate of said second inverter as an output of said inverter diverges from a 50% duty cycle.

22. The method of claim 21 wherein said act of firstly adjusting said propagation delay of said rising edge of said input signal comprises:
adjusting a slew rate of a falling edge of an output of said first inverter.

23. The method of claim 21 wherein said act of secondly adjusting said propagation delay of a falling edge of said input signal comprises:
adjusting a slew rate of a falling edge of an output of said second inverter.

24. The method of claim 21 wherein said act of reducing said magnitude of said first control signal further comprises:
further reducing said magnitude of said first control signal to increase said switching threshold of said first inverter and further increase said propagation delay of said rising edge of said input signal.

25. The method of claim 21 further comprising:
increasing said magnitude of said first control signal to increase said falling edge slew rate of said first inverter and reduce said propagation delay of a rising edge of said input signal.

26. The method of claim 25 wherein said act of increasing said magnitude of said first control signal further comprises:
further increasing said magnitude of said first control signal to decrease said switching threshold of said first inverter and further decrease said propagation delay of said rising edge of said input signal.

27. The method of claim 21 further comprising:
reducing a magnitude of said second control signal to reduce said falling edge slew rate of said second inverter and increase said propagation delay of a falling edge of said input signal.

28. The method of claim 27 wherein said act of reducing said magnitude of said second control signal further comprises: further reducing said magnitude of said second control signal to increase said switching threshold of said second inverter and further increase said propagation delay of said falling edge of said input signal.

29. The method of claim 21 further comprising:

increasing said magnitude of said second control signal to increase said falling edge slew rate of said second inverter and reduce said propagation delay of a falling edge of said input signal.

30. The method of claim 29 wherein said act of increasing said magnitude of said second control signal further comprises:

further increasing said magnitude of said second control signal to decrease said switching threshold of said second inverter and further decrease said propagation delay of said falling edge of said input signal.

31. A duty cycle adjusting circuit having compensation for self-generated duty cycle error comprising:

cascade coupled first and second voltage-controlled inverters for coupling between a supply voltage and a reference voltage;

cascade coupled third and fourth voltage-controlled inverters for coupling between said supply voltage and said reference voltage;

a first non-voltage-controlled inverter cascaded between an output of said second voltage-controlled inverter and an input of said third voltage-controlled inverter;

a second non-voltage-controlled inverter cascaded between an output of said fourth voltage-controlled inverter and an output of said circuit;

said first and fourth voltage-controlled inverters receiving a first control voltage at control inputs thereof and said second and third voltage-controlled inverters receiving a second control voltage at control inputs thereof, a magnitude of said first and second control voltages is adjusted to vary in opposite directions thereof as said output of said circuit diverges from a 50% duty cycle.

* * * * *

UNITED STATES PATENT AND TRADEMARK OFFICE
CERTIFICATE OF CORRECTION

PATENT NO. : 7,518,425 B2  Page 1 of 1
APPLICATION NO. : 11/671383
DATED : April 14, 2009
INVENTOR(S) : John D. Heightley It is certified that error appears in the above-identified patent and that said Letters Patent is hereby corrected as shown below:

Title Pg, Item (73) Assignee:

"ProMOS Technologies PTE.Ltd." should be --ProMOS Technologies PTE.LTD.--

Column 10, line 32, "filling" should be --falling--

Signed and Sealed this

Sixteenth Day of June, 2009

JOHN DOLL
*Acting Director of the United States Patent and Trademark Office*